United States Patent
Hsu et al.

[11] Patent Number: 6,093,640
[45] Date of Patent: Jul. 25, 2000

[54] OVERLAY MEASUREMENT IMPROVEMENT BETWEEN DAMASCENE METAL INTERCONNECTIONS

[75] Inventors: Jung-Hsien Hsu; Jenn-Ming Huang, both of Hsin-Chu, Taiwan

[73] Assignee: Taiwan Semiconductor Manufacturing Company, Hsin-Chu, Taiwan

[21] Appl. No.: 09/228,124

[22] Filed: Jan. 11, 1999

[51] Int. Cl.[7] .............................. H01L 21/76; H01L 21/46
[52] U.S. Cl. .................... 438/631; 438/401; 438/462; 438/975
[58] Field of Search .................... 438/631, 401, 438/462, 975; 430/30; 257/797; 148/DIG. 102

[56] References Cited

U.S. PATENT DOCUMENTS

| | | | |
|---|---|---|---|
| 5,329,334 | 7/1994 | Yim et al. | 355/53 |
| 5,578,519 | 11/1996 | Cho | 438/401 |
| 5,635,336 | 6/1997 | Bae | 430/314 |
| 5,640,053 | 6/1997 | Caldwell | 257/797 |
| 5,701,013 | 12/1997 | Hsia et al. | 250/491.1 |
| 5,911,108 | 6/1999 | Yen | 438/401 |
| 5,958,800 | 9/1999 | Yu et al. | 438/401 |
| 6,010,249 | 2/2000 | Shih et al. | 438/401 |
| 6,010,945 | 1/2000 | Wu | 438/401 |
| 6,025,638 | 2/2000 | Pogge et al. | 257/618 |

*Primary Examiner*—Charles Bowers
*Assistant Examiner*—Thanh Nguyen
*Attorney, Agent, or Firm*—George O. Saile; Stephen B. Ackerman

[57] ABSTRACT

The outer box of a box-in-box alignment pattern can be difficult to see if implemented in damascene technology. The present invention solves this problem by forming its outline from a trench that is substantially deeper than the channel used to contain the damascene wiring. This trench is formed at the same time that first vias are etched so no extra processing steps are needed, only one extra mask. The metal used for the damascene wiring also lines the inside of the trench, resulting in a structure that is easily seen during the alignment step. These outer box trenches may be simple squares or they may be ring shaped (hollow squares). Three different embodiments of the invention are described.

18 Claims, 4 Drawing Sheets

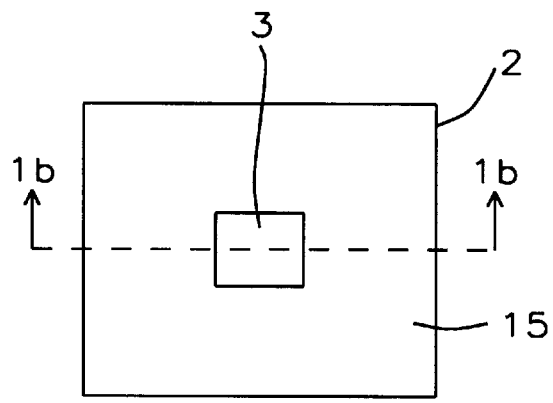
FIG. 1a – Prior Art
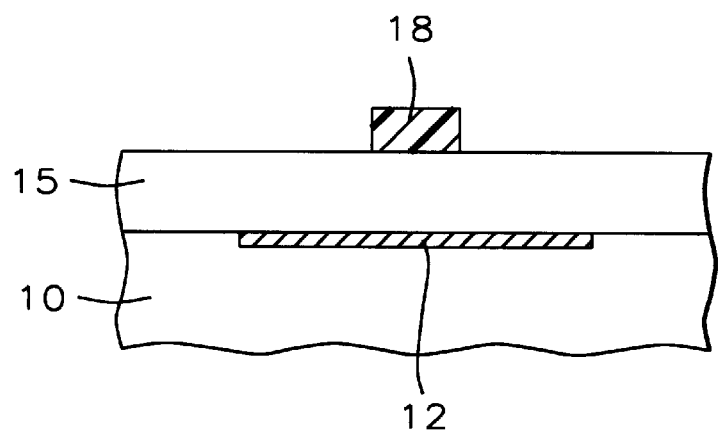
FIG. 1b – Prior Art
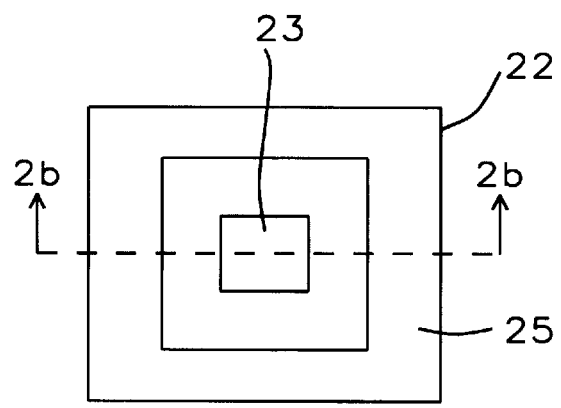
FIG. 2a – Prior Art

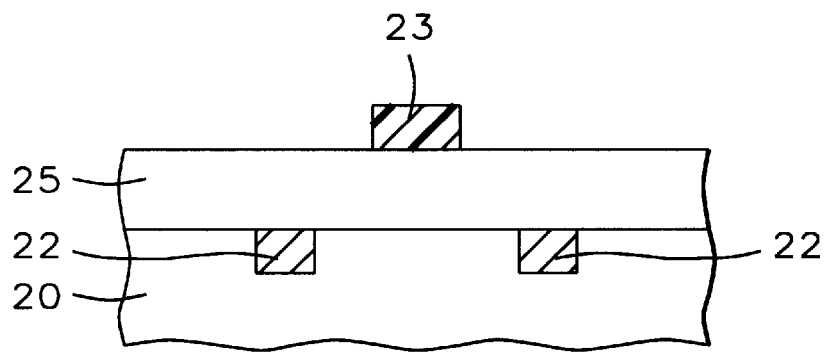
FIG. 2b – Prior Art
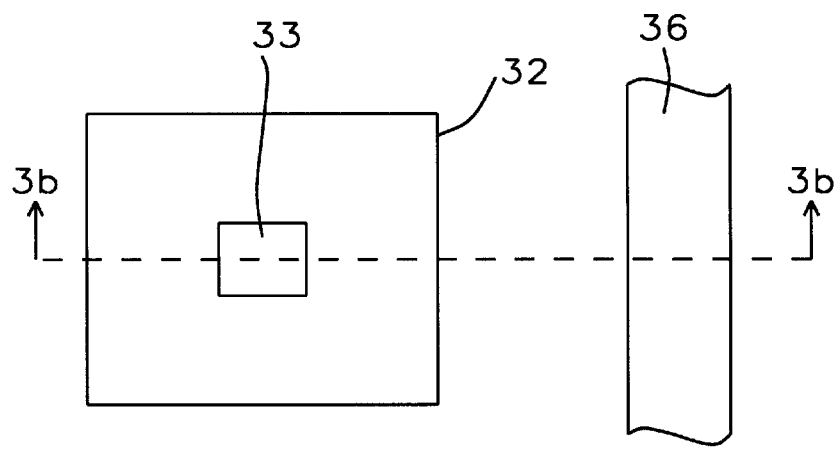
FIG. 3a
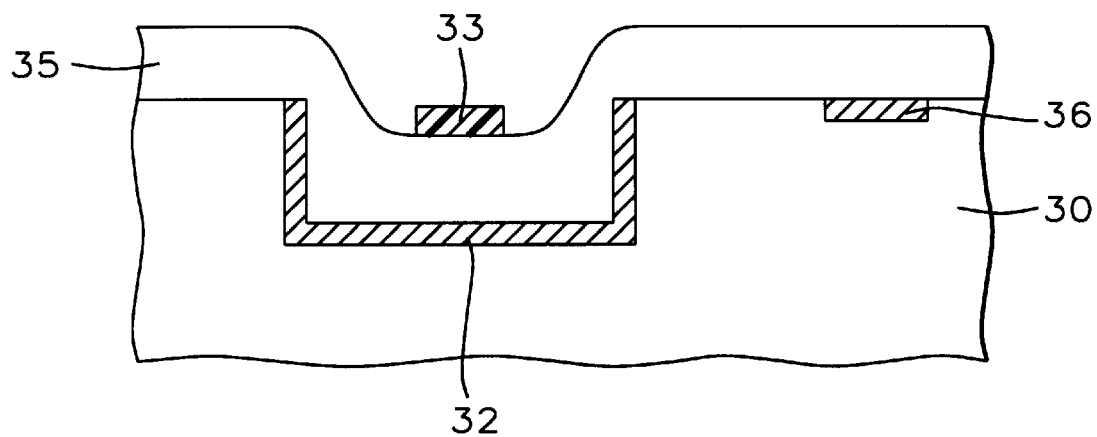
FIG. 3b

OVERLAY MEASUREMENT IMPROVEMENT BETWEEN DAMASCENE METAL INTERCONNECTIONS

FIELD OF THE INVENTION

The invention relates to the general field of photolithography with particular reference to box-in-box alignment within a damascene process.

BACKGROUND OF THE INVENTION

Pattern registration has always been a key part of successful photolithography. During the manufacture of integrated circuits many masks are used in succession and, in almost all cases, any given mask will need to be aligned relative to its predecessors with a degree of precision that is at least as well controlled as other pattern-related features such as line width.

A particular example of critical tolerances during pattern registration can be seen in the pattern format known as box-in-box. Referring now to FIG. 1a, we show an outer box 2 which has already been formed by photolithography. Inside 2 a smaller box 3 must be formed in a separate photolithograpic step. Both boxes are square shaped and the tolerances involved are extremely tight. Typically, the dimension 4 of the outer box would be in the range of between about 10 and 40 microns while that of the inner box would be between about 5 and 30 microns. Thus, the separation between boxes (for example in the region marked 5) is typically between about 5 and 20 microns.

In practice, to ensure perfect registration between masks, four box-in-box alignments are performed simultaneously, the boxes being located at the four corners of the image field. Generally, the outer box is formed from metal level 1 and the inner box from metal level 2.

It is often the case that proper box-in-box registration can present a problem because the outer box is difficult to see. It can be particularly difficult to see if the connectors are based on damascene technology. The term 'damascene' is derived from a form of inlaid metal jewelery first seen in the city of Damascus. In the context of integrated circuits it implies a patterned layer imbedded on and in another layer such that the top surfaces of the two layers are coplanar.

This can be better understood by reference to FIG. 1b which is a cross-section of FIG. 1a through 1b—1b. The outer box is seen to be a metal filled trench 12 which extends downwards below the surface of dielectric layer 10. 10 has been overcoated with inter-metal dielectric layer 15. The inner box is a photoresist pattern 18 which will be used to protect portions of layer 15 during etching. During alignment, trench 12 is very difficult to see because of poor contrast.

In FIG. 2a we show a slightly different version of a box-in-box, favored in cases where Damascene is being applied. Inner box 23 is essentially the same as before but the outer box no longer extends over the full area below 23. Instead it takes the form of a hollow square that surrounds the inner box. For ease of reference, we call such a box a ring shaped box. The region between the inner and outer dimensions of the ring shaped box will be referred to as a stripe.

A cross-section of the ring shaped box seen in FIG. 2a is shown in FIG. 2b. The outer box is seen to be made up of the damascene conductor 22. As was the case with the first example, an outer box of this type is often difficult to see during an alignment process.

A number of approaches to simplifying the alignment process can be found in the prior art. For example, Yim et al.(U.S. Pat. No. 5,329,334 Jul. 1994) describes a test reticle that includes a number of orthogonally arranged alignment marks of various shapes and sizes. Bae (U.S. Pat. No. 5,635,336 Jun. 1997) improves the box-in-box procedure by forming a groove along the inside boundary line of the outer box, while Hsia et al. (U.S. Pat. No. 5,701,013 Dec. 1997 describe an alignment pattern that combines the wafer critical dimension and the box-in-box overlay target into a single structure, allowing them both to be checked in a single operation.

It should be noted that none of the above-cited examples of the prior art mention the damascene process or the alignment problems peculiar to that particular process.

SUMMARY OF THE INVENTION

It has been an object of the present invention to provide a method for manufacturing a box-in-box alignment pattern that is easy to see.

A further object of the invention has been that said method be part of a process for manufacturing integrated circuits that use damascene technology for the interconnections.

A still further object has been that said method be fully compatible with, and add minimal expense to, existing methods for manufacturing damascene connectors.

These objects have been achieved by forming the outline of the outer box by etching a trench that is substantially deeper than the channel used to contain the damascene wiring. This is done at the same time that first vias are formed so no extra processing steps are needed, only one extra mask. The metal used for the damasscene wiring also lines the inside of said trench, resulting in a structure that is easily seen during the alignment step. These outer box trenches may be simple squares or they may be ring shaped (hollow squares).

BRIEF DESCRIPTION OF THE DRAWINGS

FIGS. 1a and 1b show a box-in-box alignment pattern formed using damascene technology.

FIGS. 2a and 2b are similar to FIG. 1 except that the outer box is ring shaped.

FIGS. 3a and 3b illustrate a first embodiment of the invention wherein an outer box, similar to that shown in FIG. 1, is formed using a non damascene approach at the same time that damascene style connectors are formed.

DESCRIPTION OF THE PREFERRED EMBODIMENTS

Figure 4A:
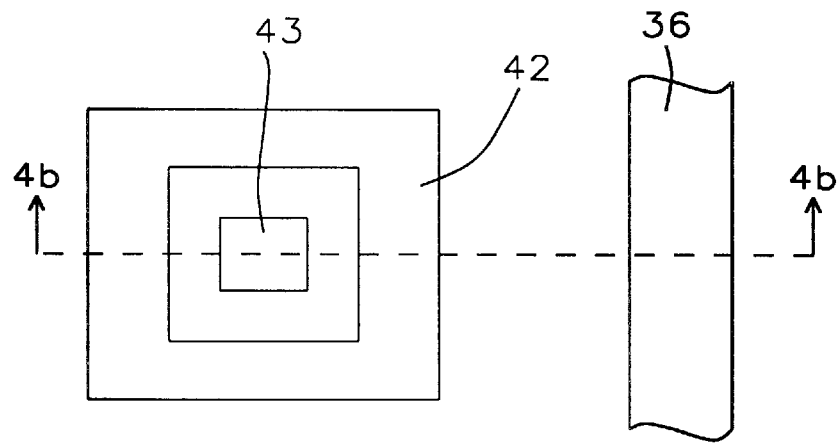
FIGS. 4a and 4b illustrate a second embodiment of the invention wherein a ring shaped outer box, similar to that shown in FIG. 2, is formed using a non damascene approach at the same time that damascene style connectors are formed.

The present invention provides a process, fully compatible with damascene technology, which makes the outer box much easier to see during box-in-box alignment. Three different embodiments are described below:

1st EMBODIMENT

Referring now to FIG. 3a, inner box 33 is shown inside outer box 32. In this view the boxes appear to be similar to 3 and 2 in FIG. 1a, respectively. Also shown in this plan view is a short length of connective wiring 36.

A cross-section of FIG. 3a, through 3b—3b, is shown in FIG. 3b. An example of damascene technology is manifested in connecting wire 36 which is seen to lie inside an etched groove or channel which it just fills so that the top of the wiring layer is flush with the surface of dielectric layer 30. By contrast, outer box 32 can be seen to not be implemented in damascene technology. Instead, it extends some distance into layer 30 so that a distinct depression 37 in layer 35 is formed, making said outer box much easier to see during alignment.

The method of the first embodiment enables damascene technology to be used for the wiring portions of the integrated circuit while at the same allowing a non-damascene (and therefore easily visible) outer box to be formed. The starting point for this embodiment is a partially completed integrated circuit, including first level wiring (which is not shown).

The first step is to deposit dielectric layer 30 to cover the first level wiring. Its thickness is between about 3 and 4 microns. Wiring channel 36 is then etched into the upper surface of layer 30 to a depth between about 2,000 and 15,000 Angstroms, with about 5,000 Angstroms being preferred. Next, rectangular trench 32, corresponding to the outer box, is etched into the surface of 30 to a depth between about 0.4 and 3 microns, with about 20,000 Angstroms being preferred. In all cases this depth should be significantly greater than the depth of the wiring channel. Typically, 32 is a square measuring between about 10 and 40 microns on a side. Note that this etching step is performed at the same time that vias are being etched through 30 to expose contact points within the first level wiring, so no extra step has been introduced into the regular manufacturing process.

A layer of metal such as aluminum-copper or copper is then deposited over the entire surface to a thickness that is sufficient to just overfill wiring channel 36. This is followed by a planarizing step (usually chemical mechanical polishing) which removes deposited metal until there no longer is any on the surface of 30 except inside 32. In the case of the wiring channel the metal ends up just flush with the upper surface of 30, thereby having formed a damascene connector.

Next, the inter-metal dielectric layer 35 (between about 4,000 and 30,000 Angstroms thick) is deposited over the now planarized surface 30. Said surface is plane everywhere except where trench 32 has been placed so that depression 37 forms over it. All that remains is to lay down a layer of photoresist and to expose it to an image of the next pattern. Alignment of this image is achieved by centrally locating the inner box within the outer box which is now easy to see since its edges are well marked by the edges of depression 37. Once the photoresist has been exposed and developed, inner box photoresist pattern 33 is obtained.

2nd EMBODIMENT

Referring now to FIG. 4a, inner box 43 is shown inside outer ring shaped box 42. In this view the boxes appear to be similar to 23 and 22 in FIG. 2a, respectively. Also shown in this plan view is a short length of connective wiring 36.

Figure 4B:
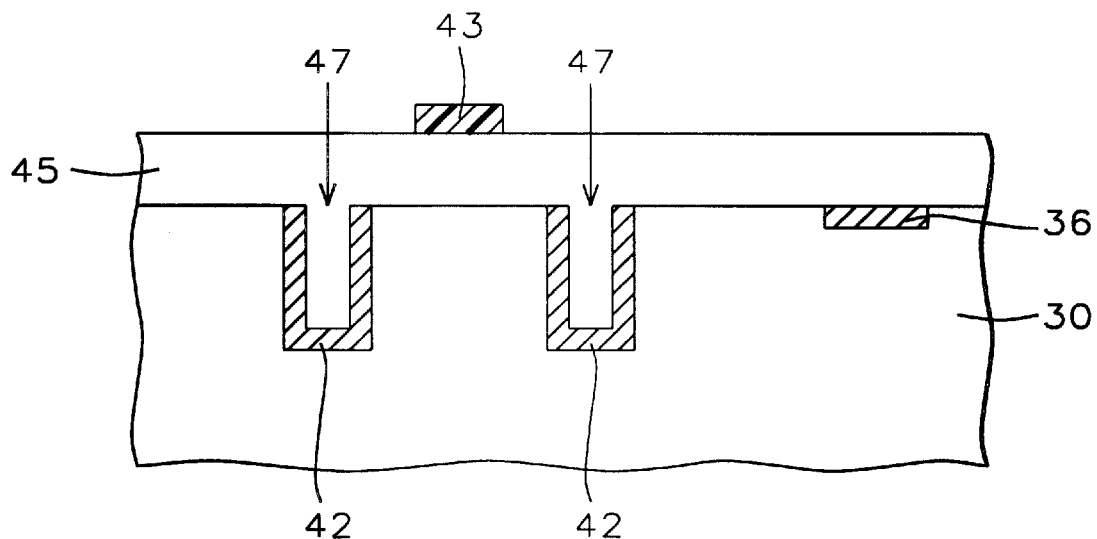

A cross-section of FIG. 4a, through 4b—4b, is shown in FIG. 4b. An example of damascene technology can be seen in connecting wire 36 which lies inside an etched groove or channel which it just fills, so that the top of the wiring layer is flush with the surface of dielectric layer 30. By contrast, outer box 32 can be seen to not be implemented in damascene technology. Instead, it extends some distance into layer 30 forming a deep, metal lined trench with a narrow stripe width, making said outer box much easier to see during alignment.

The method of the second embodiment enables damascene technology to be used for the wiring portions of the integrated circuit while at the same allowing a non-damascene (and therefore easily visible) outer box to be formed. The starting point for this embodiment is a partially completed integrated circuit, including first level wiring (which is not shown).

The first step is to deposit dielectric layer 30 to cover the first level wiring. Its thickness is between about 4,000 and 30,000 Angstroms. Wiring channel 36 is then etched into the upper surface of layer 30 to a depth between about 2,000 and 15,000 Angstroms, with about 5,000 Angstroms being preferred. Next, ring shaped trench 42, corresponding to the outer box, is etched into the surface of 30 to a depth between about 4,000 and 30,000 Angstroms, with about 20,000 Angstroms being preferred. The stripe width of the ring trench is between about 1 and 5 microns, with about 2 microns being preferred. In all cases this stripe width should be greater than twice the thickness of the metal layer that will be deposited in the next step. Typically, 42 is a hollow square measuring between about 10 and 40 microns on its outside dimension. Note that this etching step is performed at the same time that vias are being etched through 30 to expose contact points within the first level wiring, so no extra step has been introduced into the regular manufacturing process.

A layer of metal such as aluminum-copper or copper is then deposited over the entire surface to a thickness that is sufficient to just overfill wiring channel 36. This is followed by a planarizing step (usually chemical mechanical polishing) which removes deposited metal until there no longer is any on the surface of 30. Metal in the wiring channel 36 ends up just flush with the upper surface of 30, thereby having formed a damascene connector. Note that there is no depression over trench 47 because of its narrow width.

Next, the inter-metal dielectric layer 45 (between about 4,000 and 30,000 Angstroms thick) is deposited over the now planarized surface 30. Said surface is plane everywhere including over ring shaped trench 42. All that remains is to lay down a layer of photoresist and to expose it to an image of the next pattern. Alignment of this image is achieved by centrally locating the inner box within the outer box which is now easy to see because of the two closely spaced walls of trench 42. Once the photoresist has been exposed and developed, inner box photoresist pattern 43 is obtained.

3rd EMBODIMENT

Figure 5A:
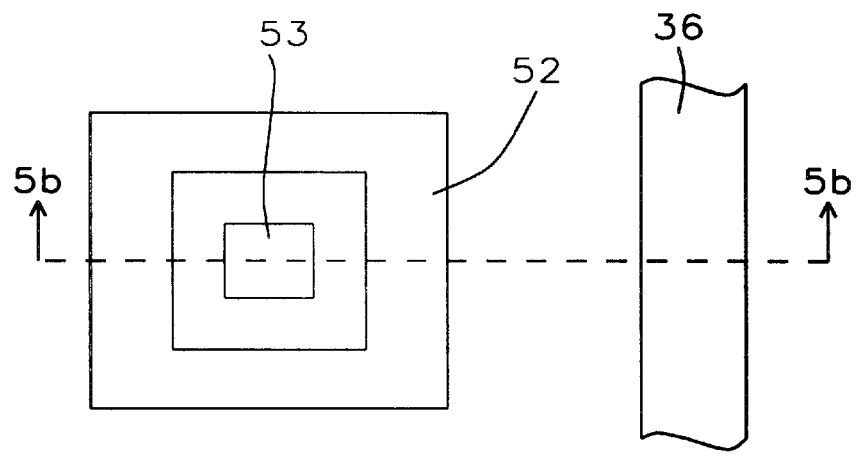
FIGS. 5a and 5b illustrate a third embodiment of the invention that is similar to the second embodiment except that the stripe width of the outer box is significantly greater than that of the box formed according to the second embodiment.

Referring now to FIG. 5a, inner box 43 is shown inside outer ring shaped box 42. In this view the boxes appear to be similar to 23 and 22 in FIG. 2a, respectively, except that in this version the stripe width for the ring shaped outer box is larger. Also shown in this plan view is a short length of connective wiring 36.

Figure 5B:
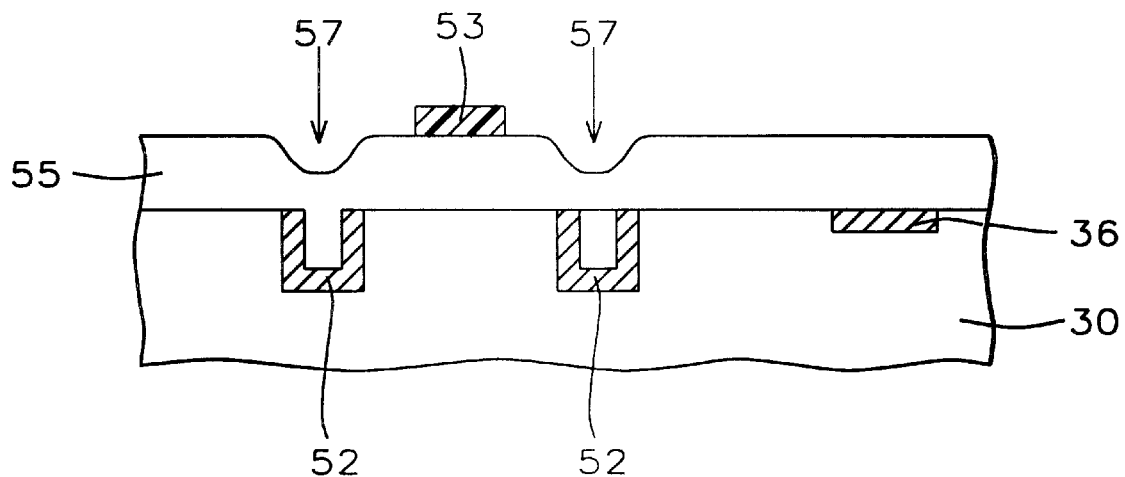

A cross-section of FIG. 5a, through 5b—5b, is shown in FIG. 5b. An example of damascene technology is included in the form of connecting wire 36 which is seen to lie inside an etched groove or channel which it just fills so that the top of the wiring layer is flush with the surface of dielectric layer 30. By contrast, outer box 52 can be seen to be implemented in something other than damascene technology. Instead, it extends some distance into layer 30 forming a metal trench lined with a metal layer. Because of the relatively large stripe width, wherever it is overlaid by dielectric layer 55 there is a depression 57 in the top surface of 55. This makes the outer box much easier to see during alignment.

The method of the second embodiment enables damascene technology to be used for the wiring portions of the integrated circuit while at the same allowing a non-damascene (and therefore easier to see) outer box to be formed. The starting point for this embodiment is a partially completed integrated circuit, including first level wiring (which is not shown).

The first step is to deposit dielectric layer 30 to cover the first level wiring. Its thickness is between about 4,000 and 30,000 Angstroms. Wiring channel 36 is then etched into the upper surface of layer 30 to a depth between about 2,000 and 15,000 Angstroms, with about 5,000 Angstroms being preferred. Next, ring shaped trench 52, corresponding to the outer box, is etched into the surface of 30 to a depth between about 4,000 and 30,000 Angstroms, with about 20,000 Angstroms being preferred. In all cases this depth should be significantly greater than the depth of the wiring channel. The stripe width of the ring trench is between about 1 and 5 microns, with about 2 microns being preferred. In general, this stripe width should be about twice the thickness of the inter-metal dielectric layer that will be deposited later on. Typically, 52 is a hollow square measuring between about 10 and 40 microns on its outside dimension. Note that this etching step is performed at the same time that vias are being etched through 30 to expose contact points within the first level wiring, so no extra step has been introduced into the regular manufacturing process.

A layer of metal such as aluminum-copper or copper is then deposited over the entire surface to a thickness that is sufficient to just overfill wiring channel 36. This is followed by a planarizing step (usually chemical mechanical polishing) which removes deposited metal until there no longer is any on the surface of 30 except inside 52. For the wiring channel the metal ends up just flush with the upper surface of 30, thereby having formed a damascene connector.

Next, the inter-metal dielectric layer 55 (between about 4,000 and 30,000 Angstroms thick) is deposited over the now planarized surface 30. Said surface is plane everywhere except where trench 32 has been placed so that depression 57 forms over it. All that remains is to lay down a layer of photoresist and to expose it to an image of the next pattern. Alignment of this image is achieved by centrally locating the inner box within the outer box which is now easy to see since its edges are well marked by the edges of depression 57. Once the photoresist has been exposed and developed, inner box photoresist pattern 53 is obtained.

While the invention has been particularly shown and described with reference to the preferred embodiments thereof, it will be understood by those skilled in the art that various changes in form and details may be made without departing from the spirit and scope of the invention.

What is claimed is:

1. A method for forming an outer box for box-in-box alignment with an inner box, within a damascene process, comprising:

providing a partially completed integrated circuit, including first level wiring;

depositing a first dielectric layer, having an upper surface;

etching a wiring channel in said upper surface, to a first depth;

etching a rectangular trench, corresponding to said outer box, in said upper surface to a second depth that is greater than said first depth;

depositing a metal layer to a thickness sufficient to just overfill the wiring channel;

planarizing the upper surface until metal in the wiring channel is flush with said upper surface, thereby forming a damascene connector;

depositing an inter-metal dielectric layer over said planarized surface, thereby forming a depression over the rectangular trench and making the outer box easier to see;

laying down a layer of photoresist;

aligning an image of the inner box within the outer box; and exposing and developing the photoresist.

2. The method of claim 1 wherein the first dielectric layer is deposited to a thickness between about 4,000 and 30,000 Angstroms.

3. The method of claim 1 wherein the depth of the wiring channel is between about 2,000 and 5,000 Angstroms.

4. The method of claim 1 wherein the depth of the rectangular trench is between about 4,000 and 30,000 Angstroms.

5. The method of claim 1 wherein the rectangular trench has a width between about 1 and 5 microns.

6. The method of claim 1 wherein the inter-metal dielectric layer is deposited to a thickness between about 4,000 and 30,000 Angstroms.

7. A method for forming an outer box for box-in-box alignment with an inner box, within a damascene process, comprising:

providing a partially completed integrated circuit, including first level wiring;

depositing a first dielectric layer, having an upper surface;

etching a wiring channel in said upper surface, to a first depth;

etching a ring shaped trench, having a stripe width and corresponding to said outer box, in said upper surface to a second depth that is greater than said first depth;

depositing a metal layer to a thickness that is sufficient to just overfill the wiring channel and that is less than half said stripe width;

planarizing the upper surface until metal in the wiring channel is flush with said upper surface, thereby forming a damascene connector;

depositing an inter-metal dielectric layer over said planarized surface;

planarizing the inter-metal dielectric layer;

laying down a layer of photoresist;

aligning an image of the inner box within the outer box; and exposing and developing the photoresist.

8. The method of claim 7 wherein the first dielectric layer is deposited to a thickness between about 4,000 and 30,000 microns.

9. The method of claim 7 wherein the depth of the wiring channel is between about 2,000 and 15,000 Angstroms.

10. The method of claim 7 wherein the depth of the circular trench is between about 4,000 and 30,000 Angstroms.

11. The method of claim 7 wherein the stripe width of the circular trench is between about 1 and 5 microns.

12. The method of claim 7 wherein the inter-metal dielectric layer is deposited to a thickness between about 4,000 and 30,000 Angstroms.

13. A method for forming an outer box for box-in-box alignment with an inner box, within a damascene process, comprising:

providing a partially completed integrated circuit, including first level wiring;

depositing a first dielectric layer, having an upper surface;

etching a wiring channel in said upper surface, to a first depth;

etching a ring shaped trench, having a stripe width and corresponding to said outer box, in said upper surface to a second depth that is greater than said first depth;

depositing a metal layer to a thickness that is sufficient to just overfill the wiring channel;

planarizing the upper surface until metal in the wiring channel is flush with said upper surface, thereby forming a damascene connector;

depositing an inter-metal dielectric layer over said planarized surface, to a thickness that is twice said stripe width, whereby a depression is formed over the circular trench thereby making the outer box easier to see;

laying down a layer of photoresist;

aligning an image of the inner box within the outer box; and exposing and developing the photoresist.

14. The method of claim 13 wherein the first dielectric layer is deposited to a thickness between about 0.4 and 3 microns.

15. The method of claim 13 wherein the depth of the wiring channel is between about 2,000 and 15,000 Angstroms.

16. The method of claim 13 wherein the depth of the circular trench is between about 4,000 and 30,000 Angstroms.

17. The method of claim 13 wherein the stripe width of the circular trench is between about 1 and 5 microns.

18. The method of claim 13 wherein the inter-metal dielectric layer is deposited to a thickness between about 0.4 and 3 microns.

* * * * *